United States Patent [19]
Bellows et al.

[11] Patent Number: 5,728,602
[45] Date of Patent: Mar. 17, 1998

[54] SEMICONDUCTOR WAFER MANUFACTURING PROCESS WITH HIGH-FLOW-RATE LOW-PRESSURE PURGE CYCLES

[75] Inventors: Craig A. Bellows; Landon B. Vines, both of San Antonio, Tex.

[73] Assignee: VLSI Technology, Inc., San Jose, Calif.

[21] Appl. No.: 657,148

[22] Filed: Jun. 3, 1996

[51] Int. Cl.$^6$ .................................................. H01L 21/302
[52] U.S. Cl. .......................................... 437/225; 437/238
[58] Field of Search ................................... 437/225, 238, 437/250; 427/331, 444

[56] References Cited

U.S. PATENT DOCUMENTS 4,223,048   9/1980   Engle, Jr. ..................................... 427/39

*Primary Examiner*—Charles L. Bowers, Jr.
*Assistant Examiner*—Vanessa Acosta
*Attorney, Agent, or Firm*—Clifton L. Anderson

[57] ABSTRACT

A purge process for an LPCVD TEOS silicon dioxide deposition method uses a series of five purge cycles to allow low-defect wafer processing with less frequent chamber removal and cleaning. The purge process begins by loading dummy wafers into the chamber. Chamber pressure is reduced to below 20 mTorr. A maximal nonreactant gas flow for two minutes is used to dislodge and carry away contaminants such as flakes from silicon dioxide previously deposited on the chamber wall. After the first four of five purge cycles, the method returns to the reduction of chamber pressure, e.g., by maintaining the vacuum on while the gas sources are turned off. After the fifth cycle, the chamber is slowly filled with nitrogen until ambient pressure is reached. Then the dummy wafers are removed. The system is then ready for processing product wafers with reduced particle counts. The purge process is benign in that it only uses equipment and procedures of the type used during product wafer processing. Maintenance involving chamber removal and cleaning is required much less often so that manufacturing throughput is enhanced.

5 Claims, 2 Drawing Sheets

SEMICONDUCTOR WAFER MANUFACTURING PROCESS WITH HIGH-FLOW-RATE LOW-PRESSURE PURGE CYCLES

BACKGROUND OF THE INVENTION

The present invention relates to semiconductor processing and more particularly, to a method of operating semiconductor wafer processing equipment. A major objective of the present invention is to increase semiconductor manufacturing throughput by reducing equipment maintenance downtime.

Much of modern progress is attributable to advances in semiconductor processing technology. Such advances have provided ever greater data and signal processing functionality at smaller sizes, higher speeds and lower costs. Beginning with a silicon wafer, a typical wafer manufacturing sequence involves depositing various conductive and dielectric materials on the wafer, photolithographically defining a pattern mask on a deposited material, and etching exposed material to transfer the mask pattern onto the deposited material. Other common steps are thermally growing silicon dioxide on exposed silicon and implantihg various dopants into silicon to affect its electrical properties.

Each of these steps requires carefully controlled conditions and freedom from contamination. To these ends, a semiconductor processing station can include several processing chambers, each devoted to a specific processing step, and mechanics for transferring wafers from chamber to chamber. Generally, the interior of a chamber degrades every time it is used, so some form of maintenance is required.

The maintenance demands of deposition chambers are particularly severe since material to be deposited on the wafers is incidentally depdsited on the chamber wall, as well as in the chamber inlets and outlets. Material deposited at these locations during one run can flake off and contaminate wafers during a subsequent run. Contamination buildup tends to be slow enough that several runs can be conducted between maintenance cycles. However, contamination tends to build exponentially, so manufacturing yields decrease dramatically once a critical contamination level is reached. Accordingly, maintenance should be performed sufficiently frequently that the critical contamination level is not exceeded.

The challenge imposed by process contamination can be illustrated in the context of a low-pressure chemical-vapor deposition (LPCVD) tetraethylorthosilicate (TEOS) silicon dioxide deposition; such a deposition is often used to electrically isolate conductive interconnect pattern layers from each other. A group of wafers is loaded into a chamber; appropriate reaction conditions are achieved by heating the chamber and lowering its internal pressure. TEOS gas is made to flow through the chamber and past the wafers so that silicon dioxide is deposited on the wafers. The TEOS gas is purged with nitrogen and the chamber is returned to atmospheric pressure and room temperature so that the wafers can be removed.

Not only is silicon dioxide deposited on the wafers but also on the interior chamber walls and at the gas inlets and outlets. During subsequent wafer runs, the silicon dioxide layer on the walls and inlets and outlets undergoes stress from thermal cycling and shock during loading and unloading. The errant silicon dioxide can flake off. The resulting loose particles can contaminate the wafers. For the first few runs, the contamination can be acceptable. However, maintenance is planned to avert a sudden exponential increase of contamination to unacceptable levels.

The maintenance can involve removing the chamber from the enclosing furnace and scrubbing of the deposited material from the interior of the chamber and the inlets and the outlets. Maintenance can be required every several hours of run time; each maintenance can consume about half a day. Accordingly, maintenance can be quite labor intensive and time consuming. A temporary solution is to insert a vacuum into the chamber between product runs to remove particles. However, the scraping of the chamber by the vacuum generates additional particles. Furthermore, the introduction and handling of vacuum handles in the chamber is effortful, time consuming. Furthermore, the effectiveness of the vacuum insertion method is limited so that chamber removal and cleaning is still required more frequently than desired. What is needed is a maintenance method that significantly reduces the effort, time and cost required for maintenance of deposition systems.

SUMMARY OF THE INVENTION

In accordance with the method of the present invention, between product process cycles, several purge process cycles are implemented without moving the chamber from the enclosing furnace. The purge process can begin with loading of dummy wafers into the chamber. The chamber is then evacuated, preferably to well below 1 Torr. This is followed by a relatively massive flow, preferably greater than 300 sccm, of nonreactant gas while the vacuum system is on. The resulting pressure wave, turbulence, and gas flow help dislodge and remove potential contaminate from the chamber and flow tubing.

The next purge cycle begins with another evacuation followed by another massive gas flow. For the second and subsequent purge cycles, evacuation can be effected by turning off the gas source while leaving the vacuum system on. Once a sufficient number of purge cycles is complete, the chamber is slowly filled with nitrogen until ambient pressure is attained. At that point, the dummy wafers can be removed. This completes the purge process and readies the system for the next product wafer process.

The method is intended primarily to remove contaminants accruing within a process chamber such as that used for semiconductor processing. More specifically, the method can be used to reduce contamination and/or more burdensome maintenance methods in a deposition chamber, where deposition material can become deposited on the chamber wall and later contaminate wafers during subsequent runs.

During a product run, a series of wafers can be processed together. The wafers toward either end of the series can be dummy wafers since boundary conditions near the ends of the chamber are not conducive to uniform and reliable processing. Some of the dummy wafers can be used in particle counts. An acceptable particle count is 5 particles per wafer or less. Once contamination becomes critical, it soon exceeds a count of 50 particles per wafer, so that number can be used to signal the need for a maintenance cycle.

During a product run, a chamber is evacuated and heated. TEOS gas (plus some oxygen) is made to flow past the wafers, resulting in silicon dioxide deposition on the wafers and the chamber wall. Once the deposition is complete, nitrogen is admitted slowly into the chamber to release the vacuum and purge the reactant gases. Once the chamber reaches room temperature and pressure, the wafers can be removed. The flow rate used to release the vacuum during the purge cycles is preferably at least twice, even five times, the flow rate used to release the vacuum during the product cycles.

One advantage of the inventive method is that no disassembly is required during the purging. Furthermore, no equipment or conditions other than those within the process capability of the processing chamber system are required. Equipment exposure to damage is minimized. Little human effort is required to implement the method. The time the equipment is off line is minimized. While occassional chamber removal and cleaning is still required, the frequency of the more disruptive maintenance processes are greatly reduced. These and other features and advantages of the present invention are apparent from the description below with reference to the following drawings.

DESCRIPTION OF THE PREFERRED EMBODIMENTS

Figure 1:
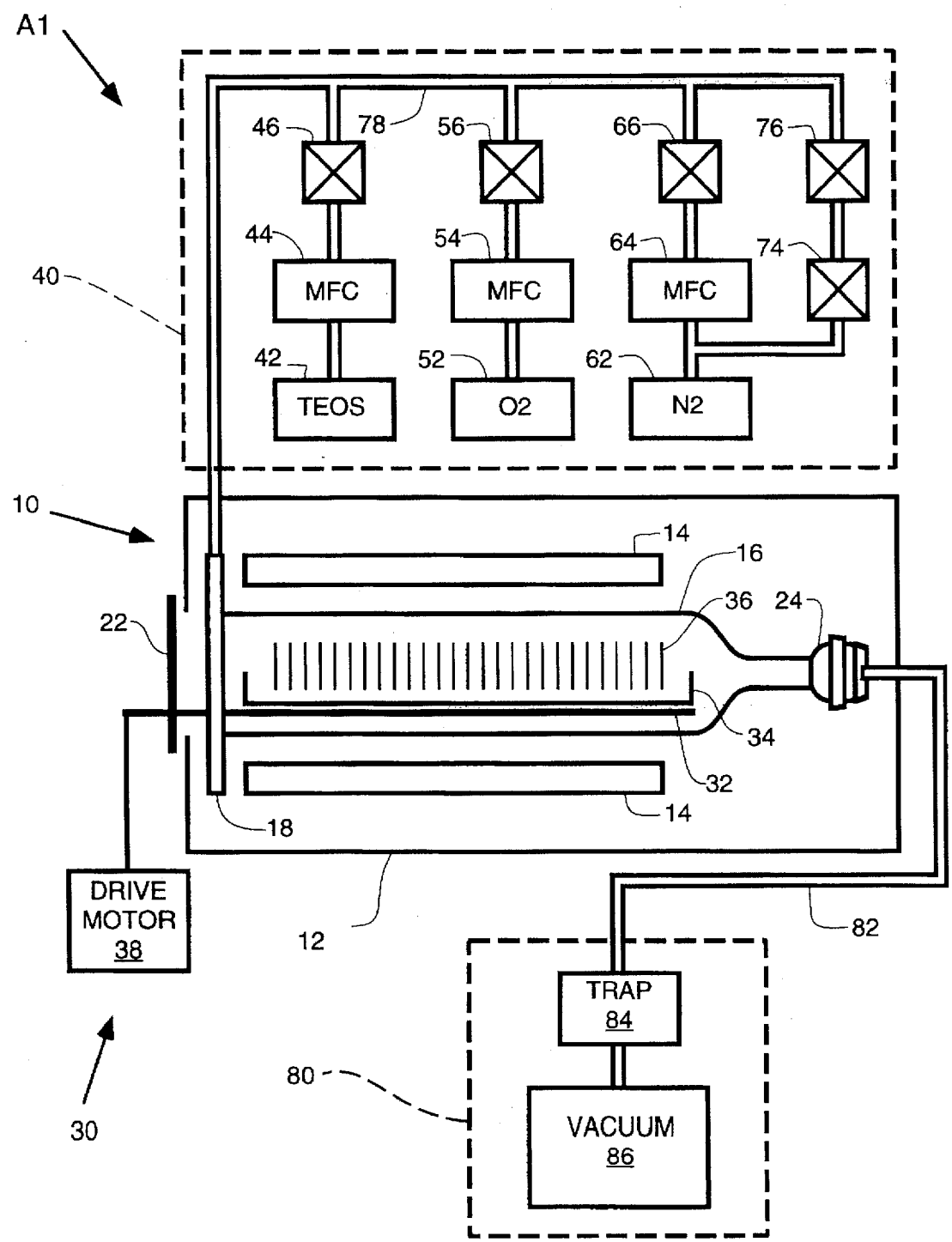
FIG. 1 is a wafer deposition system in the context of which a method of the present invention is practiced.

An LPCVD TEOS system A1 for depositing silicon dioxide on semiconductor wafers comprises a furnace subsystem 10, a wafer loading subsystem 30, a gas introduction subsystem 40, and an exhaust subsystem 80, as shown in FIG. 1. Furnace subsystem 10 includes a furnace enclosure 12, a cylindrical resistive heating element 14, a quartz chamber 16, a flange 18 at the entrance to chamber 16, and a furnace door 22. The exit of chamber 16 is in the form of a ball socket 24 that facilitates connection with exhaust subsystem 80.

Wafer loading subsystem 30 includes a cantilever support 32 for moving and supporting a quartz boat 34 holding wafers 36. Cantilever support 32 is moved by a motor 38 that moves cantilever 32 on guide rails (not shown). Cantilever support 32 is rigidly attached to furnace door 22, which seals against flange 18 when wafers 36 are fully inserted into chamber 16.

Gas introduction subsystem 40 includes a TEOS gas source 42, a respective mass flow controller 44, and a respective on/off valve 46, an oxygen gas source 52, a respective mass flow controller 54, and a respective on/off valve 56, and a nitrogen gas source 62, a respective mass flow controller 64, and a respective on/off valve 66. In addition, a fixed equipment low-flow valve 74 and a respective on/off valve 76 provide an alternative flow route from nitrogen gas source 62. The outputs of on/off valves 46, 56, 66, and 76 are coupled by stainless steel tubing 78 to flange 18 so that gas can be uniformly introduced into chamber 16.

Exhaust subsystem 80 includes stainless steel tubing 82, a particle trap 84, and a vacuum assembly 86. Stainless steel tubing 82 couples to ball socket 24 of chamber 16. Particle trap 84 removes particles from the exhaust stream before they can interfere with vacuum assembly 86. Particle trap 84 is a water cold trap. Vacuum assembly 86 includes in series downstream of particle trap 84, a gate valve, an automatic pressure controller (APC), a blower, a strong vacuum pump, an oil demister, and burnbox, and an exhaust duct. In parallel with the gate valve is a slow vacuum pump. These unillustrated vacuum assembly components are conventional.

Figure 2:
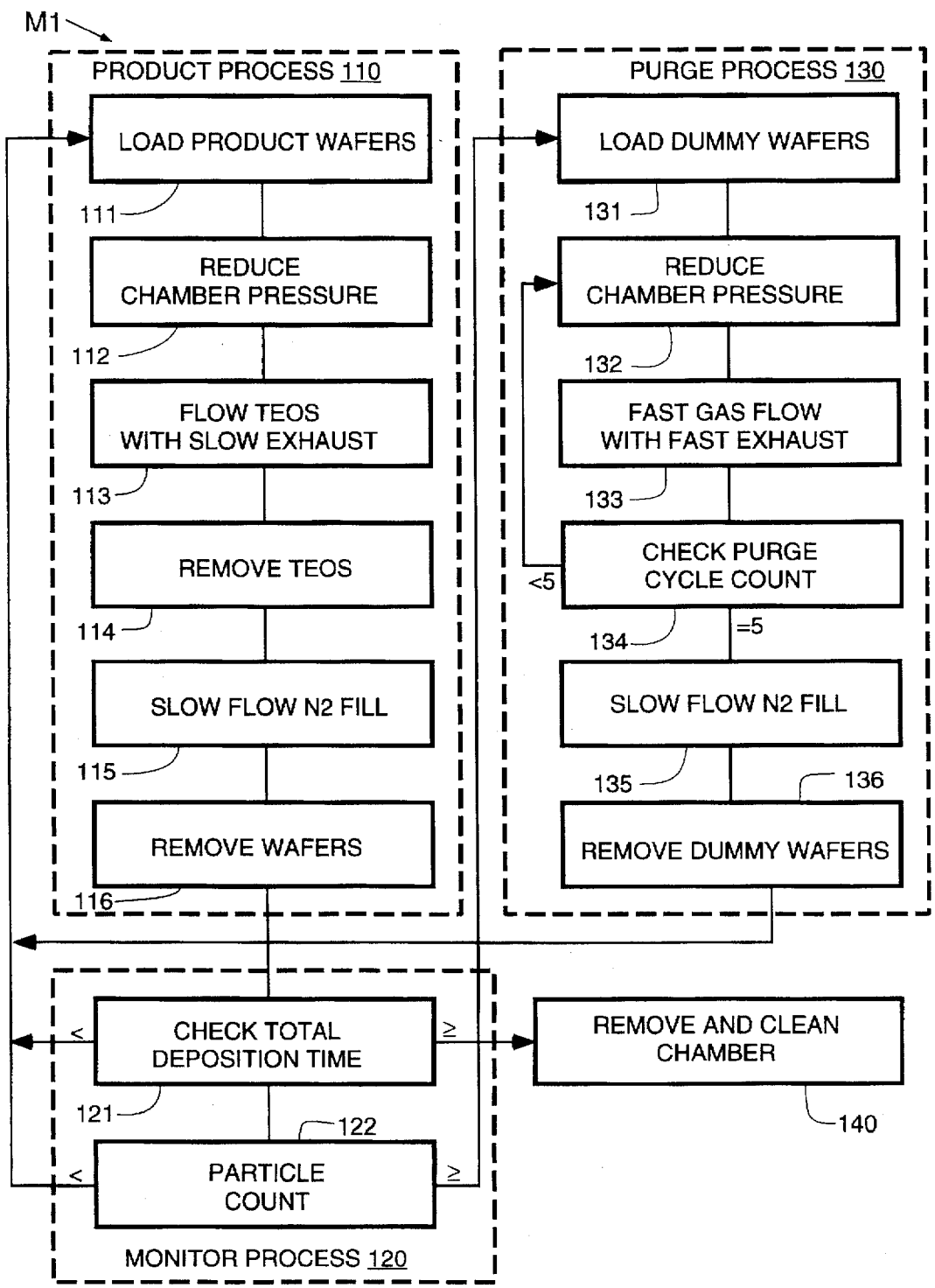
FIG. 2 is a flow chart of the method practiced in the context of the system of FIG. 1.

A method M1 practiced in the context of deposition system A1 is flow charted in FIG. 2. Method M1 comprises four basic processes, a product process 110, a monitor process 120, a purge process 130, and a clean process 140. Product process begins with a step 111 of loading product wafers into chamber 16. This step 111 involves loading 50 product wafers (wafers expected to yield useful devices when manufacturing is complete) in the fifty center slots of 100-slot quartz boat 34. At this point, boat 34 is mounted on cantilever support 32, which is retracted from chamber 16. The twenty-five slots at either end of the boat are filled with dummy wafers (not intended to yield useful integrated circuits, but included as test wafers and to contribute to the uniformity of process conditions for the bracketed product wafers). Once the wafers are loaded into boat 34, drive motor 38 is activated to insert cantilever support 32 and boat 34 fully into chamber 16 so that chamber 16 is sealed by door 22. A leak check is typically performed at this point.

Once the wafers are loaded, chamber pressure is reduced at step 112 by evacuating air from chamber 16. This step involves several substeps. Air is removed slowly initially using the low volume pump in parallel with the exhaust gate valve, which is closed. This minimizes pressure shock in the chamber while the quantity of air is high. Subsequently, the exhaust gate valve is open and the blower is used to bring chamber down to a low pressure. Finally, the strong vacuum pump is used to bring the chamber pressure down to the limit of the pump, e.g., below 20 millitorr (mTorr), where atmospheric pressure is 760 Torr.

TEOS gas is introduced into evacuated chamber 16 at step 113. Valve 46 is open to slowly admit TEOS gas and vacuum assembly 86 removes reacted gases slowly to maintain an internal chamber pressure of about 400 mTorr. In addition, valve 56 can be open to admit a small amount of oxygen into chamber 16 to facilitate the reaction that forms silicon dioxide. In the meantime, heater 14 is activated to provide the appropriate reaction conditions.

TEOS gas and its gaseous reaction products are removed by exhaust subsystem 80 at step 114 while all on/off valves of gas introduction subsystem 40 are closed. Chamber 16 is slowly filled by nitrogen at step 115. In this backfill step, the exhaust gate valve is closed, while nitrogen is admitted into chamber 16 via low-flow valve 74 and on/off valve 76. This results in a fixed nitrogen flow of 100 sccm (standard cubic centimeters per minute). This flow continues until chamber 16 attains ambient pressure. The wafers are removed at step 116. Drive motor 38 retracts cantilever support 32, opening furnace door 22 providing access to boat 34, which is removed with its wafers. This completes a product process cycle.

Before beginning another product cycle, monitor processes 120 determines whether a purge or a cleaning is required. At step 121, the total deposition time since the last cleaning is compared with a threshold, in this case forty-five hours. If this threshold is met, system A1 is shut down and a clean process 140 is performed.

If the threshold deposition time has not elapsed, the particle count is determined at step 122. To this end, one of the dummy wafers at the ends of boat 34 during the last product cycle is examined optically to determine the number of contamination particles thereon. If this number is less than fifty, method M1 continues with a next product cycle by returning to step 111. If the number is fifty or greater, method M1 proceeds to purge process 130.

Purge process 130 begins with a step 131 of loading dummy wafers into chamber 16; optionally, a leak check can be performed at this point. Chamber 16 is then evacuated at step 132 below 20 mTorr. Note the similarity of purge steps 131 and 132 with product steps 111 and 112. Purge process 130 diverges at step 133 which involves a fast gas flow with fast exhaust. To this end, valves 56, 66 and 76 are opened and mass flow controllers 54 and 64 are held maximally on. This provides the greatest nonreactant gas flow achievable with gas introduction subsystem 40. The oxygen flow through valve 56 is 50 sccm; the nitrogen flow through valve 66 is 500 sccm; and the nitrogen flow through valve 76 is 50 sccm for a total gas flow is 650 sccm. This flow rate is maintained for two minutes. The initial pressure wave, the continuing high flow rate, and turbulence dislodge and remove loose material in tubing 78, 82, and chamber 16.

At step 134, a count is taken of the number of purge cycles. If the count is less than five, a return is made to step 132. Note that, while in the first purge cycle, chamber evacuation begins at ambient pressure, while for the second through fifth purge cycles, chamber vacuum begins at a much lower pressure. Accordingly, for purge cycles after the first, evacuation is achieved by leaving vacuum assembly 86 on for two minutes once valves 56, 66, and 76 are turned off. Note that by shutting these valves down suddenly, a further pressure transient can be generated that can assist dislodging of contaminants.

It is not necessary to further dislodge contaminants after the last, e.g., fifth, purge cycle. Therefore, once the purge cycle count reaches five, chamber 16 is brought to ambient pressure slowly at step 135. The purge cycle ends at step 136 with the removal of the dummy wafers.

Once purge process 130 is complete, method M1 returns to product process 110. Several product cycles may be completed before another purge cycle is called for. Purge process 130 does not remove all the deposited material from chamber walls: there is a gradual build up of material that can generate contamination. Accordingly, the check of total deposition time 122 in monitor process 120 is designed to trigger a full cleaning at step 140. This full cleaning is conventional, but because of the purge cycles, it can be performed an order of magnitude less often. Thus, interruption of manufacturing is greatly reduced by the present invention.

In the preferred embodiment, a conventional clean process is implemented after a fixed total deposition time. In an alternative embodiment, a particle count is performed after each purge process. If the particle count is sufficiently low, then the product process is resumed. If the particle count indicates that the purge process is becoming insufficiently effective, a clean process is implemented. Alternative embodiments use a variety of criteria for determining when purge processes and clean processes are to be performed.

It is believed that the high flow rates, pressure waves, turbulence and other transient effects contribute to the dislodging and removal of contaminate particles. In the preferred embodiment, these effects are achieved using the available product process equipment. Different gases and different flow rates would be used for different deposition chambers. In addition, a separate high rate gas source could be dedicated to the purge process. Also, in the preferred embodiments, the flow rates are constant during a given step. However, this is not essential. Where the flow rates are varied, the relationship between the purge flow rates and the product flow rates can be expressed as average flow rates.

In the preferred embodiment, the method is applied in the context of a horizontal LPCVD TEOS deposition chamber. However, the method can be applied to systems with vertical chambers, to systems for depositing silicon dioxide by other means, to systems for depositing other materials, and for systems for performing other types of reactions, such as sputter deposition, etching, and implanting. These and other modifications to and variations upon the preferred embodiments are provided for by the present invention, the scope of which is limited only by the following claims.

We claim:

1. A wafer processing method comprising:

plural wafer product processes, each of said product processes including steps of loading product wafers into a chamber, reducing the pressure within said chamber, flowing reactant gas through said chamber, flowing nonreactant gas at a first average flow rate into said chamber so as to bring chamber pressure near ambient pressure, and removing said product wafers from said chamber; and a purge process implemented between two successive wafer product processes, said purge process including at least plural purge cycles, each purge cycle including steps of reducing pressure in said chamber, flowing gas at a second average flow rate at least twice that of said first average flow rate through said chamber.

2. A wafer processing method as recited in claim 1 wherein each purge cycle involves a step of loading dummy wafers into said chamber before said step of reducing pressure in said chamber and a step of removing dummy wafers from said chamber after said step of flowing gas at a second average flow rate through said chamber.

3. A wafer processing method as recited in claim 1 wherein said second average flow rate is greater than 300 sccm.

4. A wafer processing method as recited in claim 1 wherein in said purge process, said step of reducing pressure brings the chamber pressure below 1 torr.

5. A wafer processing method as recited in claim 1 further comprising measuring the a number of contaminant particles per wafer during respective wafer product processes, and performing said purge process when said number exceeds a critical contamination particle number.

* * * * *